United States Patent Office 3,597,216

Patented Aug. 3, 1971

3,597,216

HIGH TEMPERATURE PHOTORESIST OF CROSS-LINKED POLY(2,6 - DIMETHYL-1,4-PHENYLENE OXIDE)

Frank Berardinelli, Millington, N.J., and Jay Gervasi, Greensboro, N.C., assignors to Celanese Corporation, New York, N.Y.

No Drawing. Filed Sept. 24, 1969, Ser. No. 860,803
Int. Cl. C08f *1/16, 1/60;* G03c *1/68*
U.S. Cl. 96—115P 4 Claims

ABSTRACT OF THE DISCLOSURE

Poly (2,6-dimethyl-1,4-phenylene oxide) is used as a photoresist in the preparation of letterpress plates requiring the use of etchants under drastic conditions, such as sulfuric acid at temperatures of 140–150° C. The resist is applied to the plate from a solution in a chlorinated ethylene, preferably trichloroethylene and containing a peroxide such as t-butylperbenzoate, a cross-linking agent, e.g., the diacrylate of bis-hydroxyethyl terephthalate and thioxanthen-9-one as preferred sensitizer. The resist is particularly effective as applied to plates composed of Celcon, an acetal copolymer.

BACKGROUND OF THE INVENTION

The present invention relates to the area of graphic arts involving the production of printing plates, intaglios, etc., produced by photoengraving methods, i.e, wherein the plate is coated with a photoresponsive material, known as a photoresist, which on exposure to a suitable energy source, such as ultraviolet light, usually through a negative, insolubilizes the exposed area. The latent image thus produced is developed by washing with a solvent to remove the unaffected areas and the exposed substrate is then etched to leave a raised printing surface. This method is widely used in the newsprint industry.

As is well known in this art, various materials have been employed as the base or plate for the photoresist, particularly metals, such as copper, zinc, magnesium, etc., and glass, which upon development of the latent image are etched by strong acid etching solutions.

SUMMARY OF THE INVENTION

A primary object of the present invention is the provision of a photoresist which is stable under severe conditions of etching required in using certain plate materials. We have found, for example, that the acetal copolymer sold under the trademark name of Celcon, of the Celanese Corporation, is a commercially desirable plate material, being relatively inexpensive in comparison with the metal plates commonly employed in the printing of newspapers and magazines, and rapidly etched by concentrated sulfuric acid at temperatures of 140–150° C. It has been found, however, that the commercially available photoresists ordinarily used in the preparation of letterpress plates are not stable under the drastic conditions of acid treatment at the relatively high temperatures necessary for rapid etching of Celcon, particularly in the presence of formaldehyde, which is generated in the process.

We have found that poly-(2,6-dimethyl-1,4-phenylene oxide),

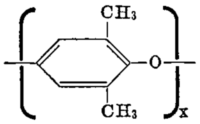

designated hereinafter as PPO, meets all the conditions above referred to, being quite stable in the sulfuric acid at the high temperatures necessary for etching, easily photo cross-linked by actinic light on inclusion of suitable additives as will be described below, and is not penetrated by the etchant. While PPO is known to cross-link by oxidative coupling of the methyl groups, it has not, so far as is known, been heretofore used as a photoresist.

As solvents for PPO we have found chloroethylenes, such as tetra- and trichloroethylene to be suitable, trichloroethylene being particularly preferred, resulting in clear stable solutions at room temperature.

In order to accomplish the photolytic cross-linking of the PPO, a peroxide which is thermally stable at the temperatures used but which decomposes by light with the aid of a photosensitizer is added. Among such peroxides which may be used are t-butylperbenzoate, t-butylperacetate, benzoyl peroxide and t-butylhydroperoxide. We have found t-butylperbenzoate to be especially suitable for this purpose in conjunction with a photosensitizer such as benzophenone or thioxanthen-9-one. While other photosensitizers such as fluoren-9-one, anthracene, 2'-acetonaphthone and Michler's ketone (4,4' bisdimethylamino) benzophenone may be used, thioxanthen-9-one is preferred.

It has been further found that the speed of the photolytic cross-linking of the PPO radical is increased by including therewith a vinyl monomer which couples more readily than the PPO itself.

For this purpose, diallyl phthalate or divinyl benzene may be used, but we have found the diacrylate of bis-hydroxyethyl terephthalate, referred to hereinafter as BHET diacrylate, to be particularly effective, being soluble in the trichloroethylene solution and resulting in a pronounced shortening of the exposure time.

Employing the system above described, there is obtained a photoresist composition which is firmly adherent to the substrate, is stable under severe conditions of high temperatures and strong acid required in etching of such plate materials as Celcon, and develops to a well resolved image with exposure time of five minutes.

While photoresists as described are particularly well suited for use on Celcon plates, because of the drastic condition necessary for etching, they can be used as well on other known substrate materials generally, such as zinc, magnesium and aluminum, etc., wherein the etching conditions are less drastic.

EXAMPLE

A composition is prepared having the following formulation:

| Component: | Parts by weight |
|---|---|
| Trichloroethylene | 1329 |
| PPO | 100 |
| t-Butylperbenzoate | 35 |
| Thioxanthen-9-one | 5 |
| BHET diacrylate | 10 |

A solution of thioxanthen-9-one, a commercial photosensitizer, must be filtered and evaporated to dryness. The freshly recovered solid is soluble in the formulation. All of the components of the composition are dissolved in the trichloroethylene solvent. The solution may be warmed gently with solvent and PPO alone, but the other components must be added at room temperature.

Using a 3" x 3" Celcon plaque, the surface is rubbed with pumice powder until uniformly roughened, then swabbed with tetrachloroethylene. The plaque is then placed on a whirler platform at rest, about 5 mil. of the photoresist solution poured on and the whirler started immediately. The whirler is allowed to spin for 5 seconds or less and the plaque immediately placed in an air oven at 75° C. for 2 minutes, then removed and allowed to cool to room temperature, after which the application is repeated.

A photographic negative is placed on the resist, the plaque and negative sandwiched between two pyrex plates held in place with ball bearing clips and exposed to a 400W General Electric (H400A33-1) mercury vapor lamp for five minutes at a distance of 2 inches. The image is developed by swirling the plaque is tetrachloroethylene, then drying in an oven at 100° C.

This gives a firmly adherent film approximately 0.5 mil. thick which is resistant to the etching.

The etching is carried out in a bed of air fluidized finely divided silica (Cab-O-Sil from Cabot Corp., Boston, Mass.) on which is deposited sulfuric acid at a 50% concentration at 140° C. The Celcon plaque is immersed in the fluidized bed and etched to a depth of 18–20 mils.

Upon removal of the plaque from the etching bath, the PPO resist coating was unaffected, examination of the Celcon plaque surface beneath the PPO resist coating showing that it had been protected from the etching environment.

What is claimed is:

1. A high temperature photoresist coating composition comprising poly (2,6 dimethyl-1,4-phenylene oxide), a peroxide which is thermally stable at the temperatures of etching, but decomposes by light with the aid of a photosensitizer, a photosensitizer selected from the group consisting of benzophenone and thioxanthen-9-one, and a vinyl monomer cross-linking agent.

2. The composition as defined in claim 1, dissolved in a solvent selected from the group consisting of trichloroethylene and tetrachloroethylene.

3. The composition as defined in claim 1, wherein the peroxide is t-butylperbenzoate.

4. The composition as defined in claim 3 and wherein the photosensitizer is thioxanthen-9-one and the vinyl monomer cross-linking agent is the diacrylate of bis-hydroxyethyl terephthalate.

References Cited

UNITED STATES PATENTS 2,986,507 5/1961 Steck ............ 204—159.16

JOHN T. GOOLKASIAN, Primary Examiner

M. E. McCAMISH, Assistant Examiner

U.S. Cl. X.R.

96—35.1; 204—159.15, 159.23; 260—874